United States Patent
Franke

(10) Patent No.: US 9,086,302 B2
(45) Date of Patent: Jul. 21, 2015

(54) MEASURING ELEMENT

(75) Inventor: Axel Franke, Ditzingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 277 days.

(21) Appl. No.: 13/258,570

(22) PCT Filed: Mar. 1, 2010

(86) PCT No.: PCT/EP2010/052527
§ 371 (c)(1),
(2), (4) Date: Sep. 22, 2011

(87) PCT Pub. No.: WO2010/124889
PCT Pub. Date: Nov. 4, 2010

(65) Prior Publication Data
US 2012/0025277 A1  Feb. 2, 2012

(30) Foreign Application Priority Data

Apr. 29, 2009 (DE) .......................... 10 2009 002 723

(51) Int. Cl.
*H01L 29/84* (2006.01)
*G01D 5/241* (2006.01)

(52) U.S. Cl.
CPC .............. *G01D 5/2412* (2013.01); *H01L 29/84* (2013.01)

(58) Field of Classification Search
CPC ............................ G01D 5/2412; H01L 29/84
USPC ....................... 257/254, 415, 420; 73/514.21; 318/568.16
See application file for complete search history.

(56) References Cited

U.S. PATENT DOCUMENTS

| 4,157,462 | A | * | 6/1979 | Blanchard .............. 200/61.45 R |
| 5,198,740 | A | * | 3/1993 | Jacobsen et al. .............. 318/687 |
| 5,457,368 | A | * | 10/1995 | Jacobsen et al. ......... 318/568.16 |
| 5,557,185 | A | * | 9/1996 | Jacobsen et al. ......... 318/568.16 |
| 5,698,934 | A | * | 12/1997 | Jin et al. ........................ 313/309 |
| 6,220,096 | B1 |  | 4/2001 | Gutierrez et al. |

FOREIGN PATENT DOCUMENTS

| EP | 0693672 A1 | 1/1996 |
| WO | 2005080921 A1 | 9/2005 |

* cited by examiner

*Primary Examiner* — Long Pham
(74) *Attorney, Agent, or Firm* — Kenyon & Kenyon LLP

(57) ABSTRACT

A measuring element for recording a deflection includes a region which is situated on a semi-conductor substrate and an electrode for influencing a conductivity of the region, the electrode being mounted deflectably in relation to the region, in such a way that an overlap region is formed between the electrode and the region, the overlap region having a dimension that is variable with a deflection of the electrode. A change in the output signal of the measuring element is a function of the conductivity of the region and is controllable by a change in the dimension of the overlap region, the change in the dimension of the overlap region having a non-linear relationship with the deflection of the electrode so that a change in the output signal of the measuring element has a non-linear relationship with the deflection of the electrode.

23 Claims, 3 Drawing Sheets

MEASURING ELEMENT

FIELD OF THE INVENTION

The present invention relates to a measuring element. In particular, the present invention relates to a micromechanical measuring element having an electrical output signal.

BACKGROUND INFORMATION

Micromechanical measuring elements are used in sensors for different areas of application. For example, acceleration sensors, yaw rate sensors, or pressure sensors may be micromechanically constructed. Such a measuring element includes both mechanical and electrical structures, which may have similar orders of magnitude and form an integrated micro-electromechanical system (MEMS) with each other. Such micro-electromechanical systems also occasionally include an actuator for parts of the mechanical structures, for example in yaw rate sensors in which a force acting upon a movable mass is to be determined. A micro-electromechanical resonator may also include such a drive.

In one form of micro-electromechanical measuring elements, a relative deflection between mechanical elements is analyzed, at least one of the mechanical elements at the same time also being part of an electronic element, which provides an output signal correlating with the mechanical deflection. Such a deflection may have the order of magnitude of the structures from which the measuring element is made. The deflection may be determined, for example, by determining a deflection-dependent capacitance.

For example, in the "moving gate" technique, a flat gate electrode of a field-effect transistor (FET) may be mounted parallel to a channel of the FET and deflected with respect to the channel. The channel is delimited by a source and a drain terminal of the field-effect transistor. A voltage is applied between the source and the drain terminals, and the gate electrode is electrically connected to the drain terminal, so that the field-effect transistor is operated as a current controller. A current flow through the field-effect transistor then changes as a function of the electric field, which is established due to the voltage between the gate electrode and the channel. If the configuration of gate electrode and channel is modified, the current flow through the field-effect transistor is ultimately also modified. Capacitive measurement is suitable for MEMS measuring sensors, since in this case there is virtually no reaction from the (deflection-dependent) current flow on the deflection of the electrode. The gate electrode and the channel are usually shaped in such a way that a region in which the two overlap is linearly changeable to a deflection of the gate electrode. The deflection modifies the size of the overlapping region, so that the electric field between gate electrode and channels, which controls the current flow through the field-effect transistor, is modified. The deflection of the gate electrode may thus be determined with the aid of the current flow through the field-effect transistor.

U.S. Pat. No. 6,220,096 B1 discusses a micro-electromechanical acceleration sensor which uses moving gate field-effect transistors (MG-FET) of the type described above in a differential circuitry for optimizing a useful signal of the sensor.

Measuring systems that process a sensor signal should usually provide an output signal which may have a linear relationship with a quantity to be measured. For this reason, usually all elements of the system are laid out to have linear characteristic curves, so that the required linear relationship exists over the entire system. In particular in the case of systems including a large number of complex processing elements, it is, however, difficult to ensure the linearity of each individual element in the required quality.

SUMMARY OF THE INVENTION

Therefore, an object of the exemplary embodiments and/or exemplary methods of the present invention is to provide a MEMS sensor with the aid of which a detection and analysis of a deflection may be improved.

This object may be achieved via the measuring element according to the description herein. The further descriptions herein specify measuring devices which are based on such a measuring element. Another description herein defines a resonator which is based on one of these measuring devices. Subclaims specify further embodiments and features.

The exemplary embodiments and/or exemplary methods of the present invention are directed to a measuring element based on a field-effect transistor. The measuring element includes a region situated on a semiconductor substrate (for example a channel of a field-effect transistor) and an electrode, which may be used to influence the conductivity of the region. The overlap region between the gate electrode and the region has a width (parallel to the direction of deflection) and a length (perpendicular to the direction of deflection). A dimension (area) of the overlap region is a function of the deflection and of the shapes of the overlapping elements. It is proposed that the gate electrode and/or the region be shaped in such a way that the dimension of the overlapping region has a non-linear relationship with the deflection of the gate electrode. This may be effected by the gate electrode and/or the region having a shape different from a rectangle.

In one specific embodiment, the gate electrode may have a conventional rectangular shape and have edges that are parallel and perpendicular to the direction of deflection, while the region has a shape different from a rectangle. In the case of a rectangular gate electrode, if the output signal should run symmetrically to a value corresponding to a 0 deflection, the region is to be shaped in the positive direction of deflection and in the negative direction of deflection with a mirror image. The shape of the region is thus symmetrical to an axis of symmetry running perpendicularly to the direction of deflection and through a deflection of 0. In alternative specific embodiments both the gate electrode and the region may assume other shapes; in particular the shapes of the region and of the gate electrode may be reversed or both the region and the gate electrode may have a shape different from a rectangle. The deviations from a conventional shape of a parallelogram or a rectangle may be greater than those due to manufacturing technological processes and, in particular, greater than approximately 3% to 5%.

In one specific embodiment, the gate electrode is rectangular and the region has a shape corresponding to a circle, from which an upper and a lower region have been removed along two separating lines running perpendicularly to the direction of movement of the gate electrode. This specific embodiment is particularly well suited for being used in a micro-electromechanical resonator.

The exemplary embodiments and/or exemplary methods of the present invention are now described in greater detail with reference to the appended drawings.

DETAILED DESCRIPTION

Figure 1A:
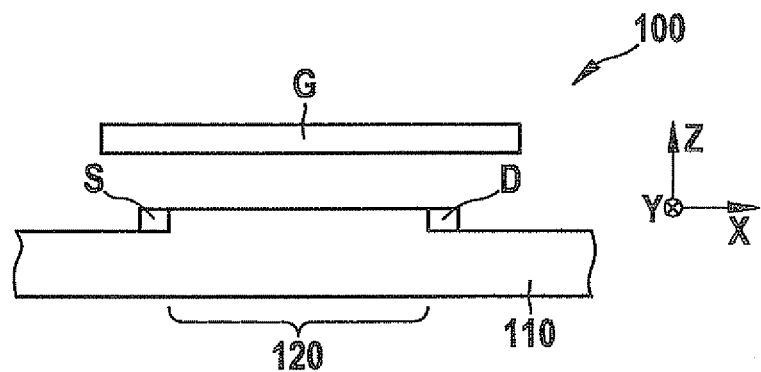
FIG. 1a shows a view of a measuring element on the basis of an MG-FET.

Identical or corresponding elements are identified in all figures using the same reference numerals.

Figure 1B:
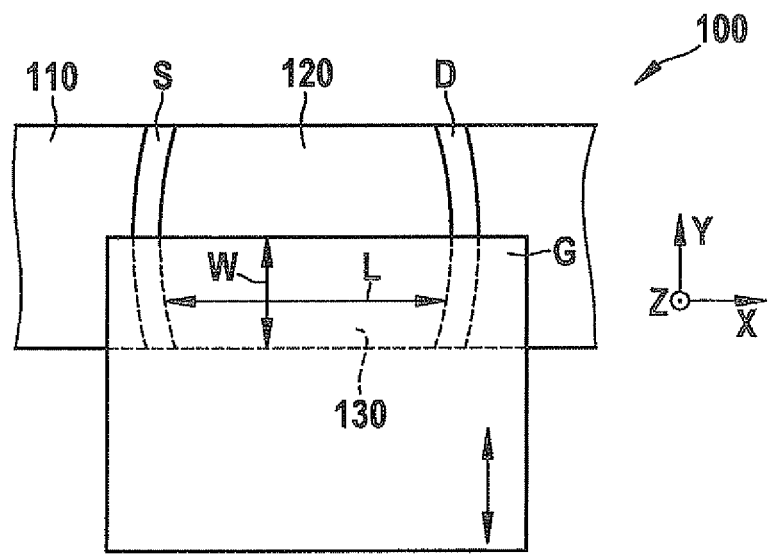
FIG. 1b shows a different view of a measuring element on the basis of an MG-FET.

FIGS. 1a and 1b show two different views of a schematic configuration of a measuring element 100 according to the principle of an MG-FET. On the right side of FIGS. 1a and 1b, coordinate systems (x, y, z) are shown for easier reference. Covered edges in FIG. 1b are illustrated by dashed lines.

A measuring element 100 includes a semiconductor substrate 110, on which a source terminal S and a drain terminal D are mounted, between which a region 120 extends. Measuring element 100 also includes a gate electrode G mounted above (in the positive z direction) region 120. Gate electrode G is situated so it is deflectable in the positive and negative y directions. A distance between gate electrode G and region 120 remains constant; the deflection occurs only along the y axis.

Not illustrated is an elastic system, which holds the gate electrode deflectably at a predefined distance over region 120 and provides restoring forces, which are variable with the deflection of gate electrode G in the positive and negative y directions. The elastic connection may include, for example, micromechanical springs. An undeflected position of the gate electrode is at a point of equilibrium of the restoring forces of the elastic connection in the positive and negative y directions. FIG. 1b shows the gate electrode in this undeflected position.

Also not illustrated is an electrical connection of gate electrode G to drain terminal D, which may include the elastic system, for example. Due to the electrical connection, measuring element 100 is operated in a current-controlled manner.

If a voltage is applied between gate electrode G and source terminal S, an electric field in region 120 induced thereby allows charge carriers to move between source terminal S and drain terminal D. If the voltage between gate electrode G and source terminal S and the vertical distance between gate electrode G and region 120 are constant, a mobility of charge carriers in the area of region 120 is a function only of a dimension of an overlap region 130 between gate electrode G and region 120. An output signal of the illustrated system is basically determined according to $I_{DS} \sim W/L$.

Gate electrode G may be deflected in the positive or negative y direction from the undeflected position shown in FIG. 1b. In the present illustration, this deflection may continue until region 120 fully overlaps with gate electrode G or until the overlap reaches the value 0; other limits are also implementable. It is apparent that there is a non-linear relationship between a deflection of gate electrode G with respect to region 120 and the dimension of overlap region 130. Overlap region 130 is determined by a length L running in the x direction and a width W running in the y direction. Length L is variable along the y direction and is defined as a function of width W at the particular y point. In other words, the course of length L is specified as non-linear over the course of width W.

The dimension of overlap region 130 results from its width W, which is proportional to the deflection of gate electrode G, and length L in its course over overlap region 130 (FIG. 1b). The relationship between the deflection of gate electrode G and the dimension of overlap region 130 is non-linear, since the course of L in the y direction is a non-linear function of W. Therefore, the course of the dimension of overlap region 130 over a deflection of gate electrode G is non-linear and therefore the relationship between the deflection and the current flow through measuring element 100 is also non-linear.

In the present example (see FIG. 1b), the shapes of source terminal S and of drain terminal D correspond to a circular or elliptical segment. Region 120 therefore has an overall surface that approximately corresponds to a longitudinal section of a barrel situated on the zx plane. In other words, the shape of region 120 results from a circle or an ellipse in the xy plane, of which an upper and a lower (with respect to y) end have been separated, the separation lines running parallel to the x direction and at the same distance from the y axis at the point y=0. The course of length L of region 120 in the y direction is described as $$L(y) = \sqrt{L_0^2 - a^2 y^2},$$

$L_0$ being defined as the length at the point y=0, and a being the ratio between the semi-diameters of the ellipse (1 in the case of a circle). To prevent contact between source terminal S and drain terminal D and to avoid the effects of a very short region (short channel effects), length L of region 120 should not fall below a critical value $L_{min}$. This results in the elliptical or circular region ending at $$|y| = \frac{1}{a}\sqrt{L_0^2 - L_{min}^2}.$$

The absolute value of the deflection of the gate electrode from its rest position y=0 should also be less than or equal to $$\frac{1}{a}\sqrt{L_0^2 - L_{min}^2},$$

so that the overlap region is greater than or equal to zero and its dimension remains a function of the motion. In the present example, the above-described shape of an ellipse or a circle capped on both sides results from this requirement for region 120.

In other specific embodiments the gate electrode may also assume other shapes. A limitation, displacement, or increase of the deflection of gate electrode G relative to overlap region 130 is also possible, for example. Furthermore, gate electrode G may be perforated, for example. Measuring element 100 may also have another region (not illustrated), which controls the conductivity of another system and is also swept over by gate electrode G. The other region may be situated in the positive or negative x direction with respect to FIGS. 1a and 1b. Source terminals S and drain terminals D of both channels may be connected in series or in a bridge circuit, for example. These and similar measures known to those skilled in the art may be used, for example for improving a measuring accuracy, increasing a resolution, and/or for implementing a predefined relationship between the output signal of measuring element 100 and the deflection of gate electrode G.

Gate electrode G may also be part of a more complex micro-electromechanical system having multiple movable elements. Gate electrode G may be fastened to one or more of these elements and/or to semiconductor substrate 110 with the aid of an elastic system, and the movable elements may include springs.

Figure 2:
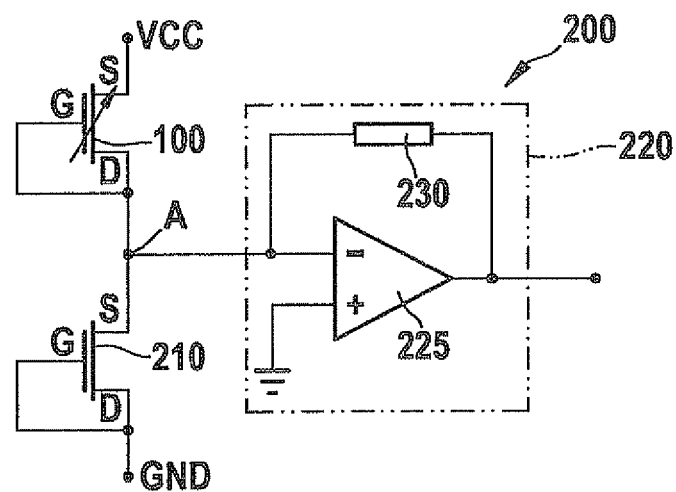
FIG. 2 shows a measuring device on the basis of the measuring element from FIG. 1.

FIG. 2 shows a measuring device 200, which is based on measuring element 100 from FIG. 1. Measuring device 200 includes measuring element 100, another measuring element 210, and, optionally, a device 220 for signal processing, which includes an operational amplifier 225 and a feedback resistor 230.

Measuring element 210 has a basically identical design to measuring element 100, and, in particular, has identical dimensions, but unlike measuring element 100, it has no movable parts. A gate electrode of measuring element 210 is fixed in a position which, on measuring device 100, corresponds to an undeflected position of its gate electrode G. In both measuring elements 100 and 210, the gate electrodes are connected to the particular drain terminals D, so that both measuring elements 100 and 210 are operated in a current-controlled manner. Measuring elements 100 and 210 are connected in series and to two terminals VCC and GND of a DC voltage source (not illustrated). Measuring elements 100 and 210 are bipolar; therefore a polarity of the DC voltage is unimportant. An output signal, which has a non-linear relationship with the deflection of gate electrode G in measuring element 100, may be picked up at a tap A between the two measuring elements 100 and 210.

Constant errors, caused, for example, by manufacturing inaccuracies of measuring elements 100 and 210, may be compensated for by combining measuring elements 100 and 210 as indicated. Device 220 for signal processing generates, in a manner known to those skilled in the art, from the signal at tap A via an operational amplifier 225 back-coupled with the aid of feedback resistor 230, a voltage signal that is variable with the deflection of gate electrode G of measuring element 100.

Figure 3:
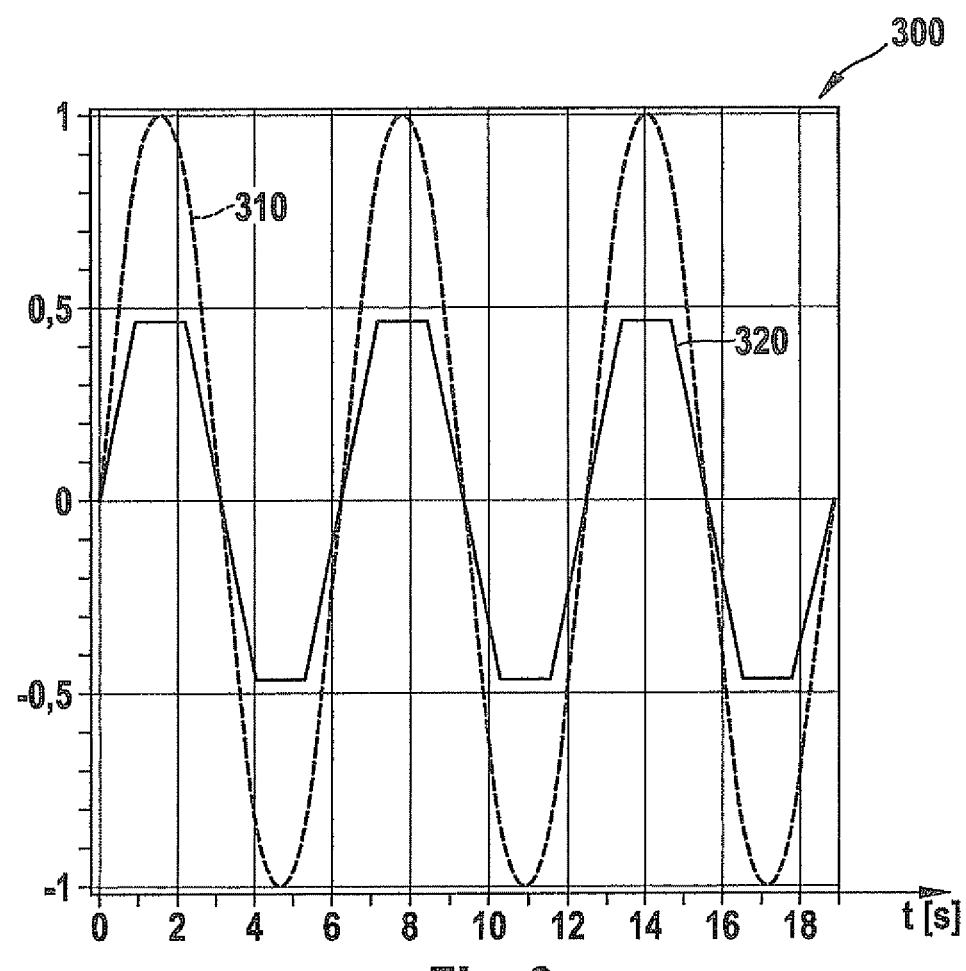
FIG. 3 shows a diagram 300, illustrating the effect of the geometry of region 120 from FIG. 1 in the measuring device from FIG. 2.

FIG. 3 shows a diagram 300, which illustrates a relationship between a harmonic deflection 310 (dashed line) of gate electrode G of measuring element 100 from FIGS. 1a, 1b, and an output signal 320 (solid line) of device 220 for signal processing from FIG. 2. Time is plotted in the horizontal direction, a percentage deflection (re 310) and a voltage (re 320) being plotted in the vertical direction.

It is apparent that curve 310 of a sinusoidal, harmonic deflection of gate electrode G induces an output voltage 320, which corresponds to a symmetric saw tooth or a trapeze. This relationship results from the special shape of region 120 as a capped circle or capped ellipse, as shown in FIG. 1b and described in greater detail above.

Sinusoidal, harmonic deflection 310 may be transmitted from a micromechanical actuator to gate electrode G. For example, a micro-electromechanical resonator may be constructed with the aid of measuring element 100 from FIG. 1 and a capacitive, piezoelectric, thermoelastic, or magnetic drive. According to its application, the resonator may be more or less damped, for example by gas included in a space in which gate electrode G is deflectably situated.

The actuator and the elements illustrated in FIG. 2 may form a micro-electromechanical signal generator, which may be used for different purposes. Using such a signal generator, a series of periodic signals of various shapes may be generated by varying the shapes of gate electrode G and/or of region 120.

Measuring element 100 may be used for different applications in micro-electromechanical and opto-microelectromechanical components. In particular it may form a measuring device 200 together with other measuring elements 100, 210, and/or a device 220 for signal processing. A non-linearity of device 220 for signal processing (and/or of another device for signal processing) may thus be compensated for via the non-linearity of the relationship between the deflection of gate electrode G of measuring element 100 and the current flow through measuring element 100, so that overall, a linear relationship exists between the deflection of gate electrode G with respect to region 120 and the output signal of the device for signal processing.

Measuring element 100, i.e., measuring device 200, may form a system or a module together with other mechanical, optical, and/or electronic components. For example, measuring element 100 may be part of an inertial sensor, a yaw rate sensor, or a micro-mirror. In the latter case, it would be an opto-mechanical micro-electromechanical system (Micro-Opto-Mechanical System, MOEMS).

Figure 4:
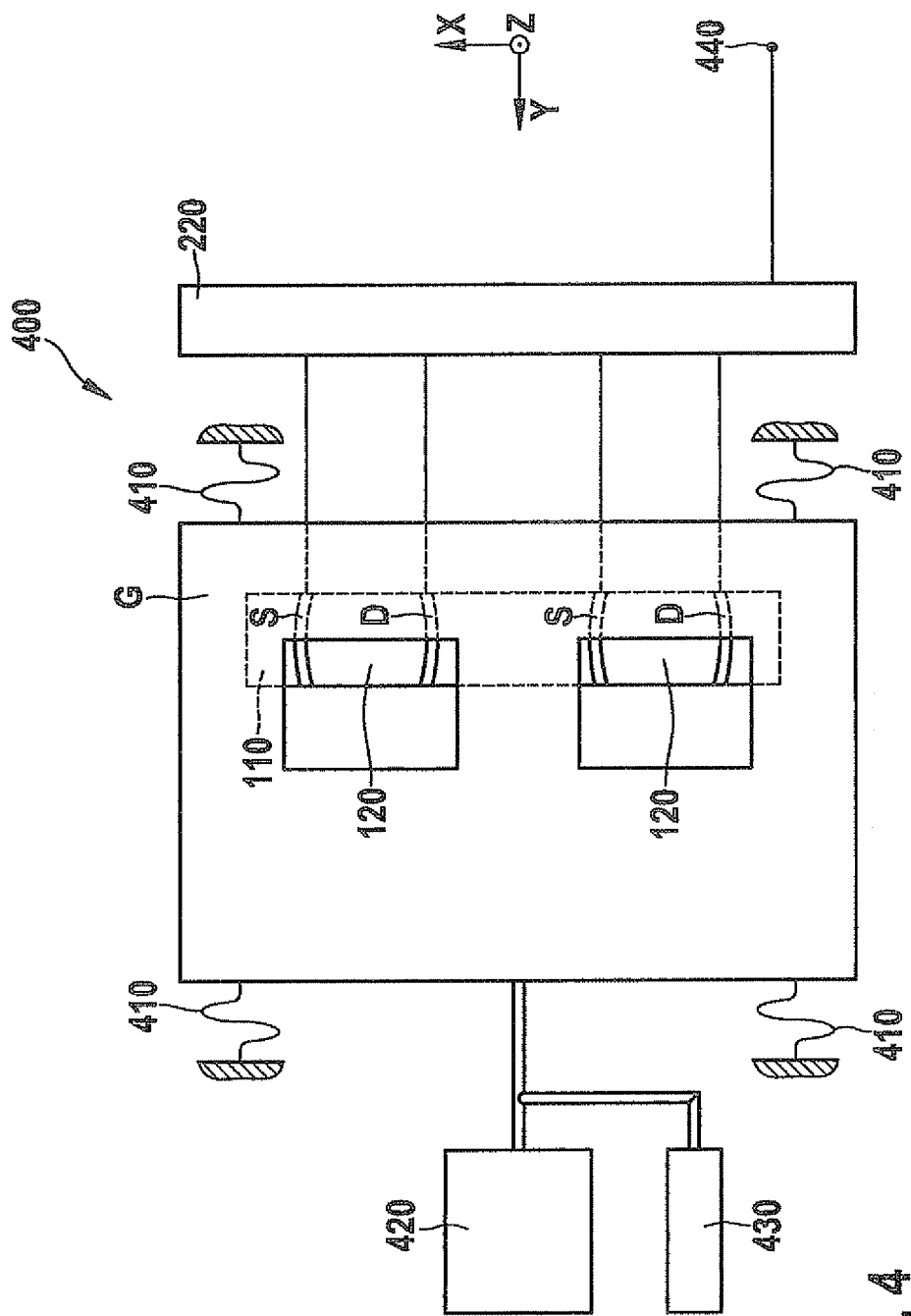
FIG. 4 shows a resonator on the basis of the measuring element from FIG. 1.

FIG. 4 shows a resonator 400 in an illustration corresponding to FIGS. 1a and 1b. On the right side of FIG. 4, a coordinate system is shown. Resonator 400 includes a substrate 110 having a plurality of source terminals S and drain terminals D, which, in pairs, delimit channels 120, a shared electrode G, a processing device 220, springs 410, a drive 420, a damper 430, and an output 440.

Processing device 220 is connected to source terminals S and drain terminals D and determines, according to the explanations above, an output signal provided at output 440. Electrode G is held over channels 120 with the aid of springs 410 in the z direction and may be deflected by drive 420 in the y direction. Electrode G has recesses, so that channels 120 overlap more or less therewith as a function of the deflection of electrode G. Due to the overlap of electrode G with multiple channels 120, an increased sensitivity of the deflection measurement may be achieved in the illustrated resonator 400.

At least one of springs 410 is simultaneously used as an electrical contact on an armature element (not shown) for resonator 400, which may carry, for example, substrate 110 or may coincide therewith. The deflection of electrode G is damped with the aid of damper 430. This may be a friction damper or an eddy current damper, or electrode G may be enclosed in a container containing a gas under a predefined pressure. The latter variant is suitable in particular for weak damping for operating resonator 400 at a high quality. Damping may also be accomplished by fluidic effects on the remaining movable structure and by material damping (anchor loss). Damper 430 is omitted, if necessary.

Electrode G may be part of a micro-mirror or connected to one. In a micro-mirror system, an actual deflection of electrode G may be determined, for example via the signal provided at output 440, and drive 420 may be activated accordingly to achieve a predefined deflection of electrode G. In another specific embodiment, electrode G may be part of an inertial system. The deflection of electrode G may be determined in absolute terms or as a function of the deflection of electrode G induced by drive 420, which allows conclusions to be drawn regarding a motion of the inertial system.

What is claimed is:

1. A measuring element for recording a deflection, comprising:
    a region situated on a semiconductor substrate; and
    an electrode for influencing the conductivity of the region, the electrode being mounted deflectably with respect to the region so that an overlap region having a dimension, which is variable with a deflection of the electrode, results between the electrode and the region;

wherein the output signal of the measuring element is a function of the conductivity of the region and is controllable via the change in the dimension of the overlap region, wherein at least one of the region and the electrode is configured so that the change in the dimension of the overlap region has a non-linear relationship with the deflection of the electrode, so that a change in the output signal of the measuring element has a non-linear relationship with the deflection of the electrode, and wherein the electrode is mounted above the region, a distance between the electrode and the region remains constant, and during the deflection of the electrode, the electrode and the region do not touch each other.

2. The measuring element of claim 1, wherein a length of the region is not constant over a width of the region.

3. The measuring element of claim 1, wherein at least one of a drain terminal and a source terminal has an edge line of the region in the shape of an elliptical segment.

4. The measuring element of claim 1, wherein a surface area of the region is determined by a width W running in a deflection direction y of the electrode and a length L of the electrode running perpendicular thereto, and the following relationship applies: $L(y)=\sqrt{W^2-y^2}$.

5. The measuring element of claim 1, wherein the region is the channel of a field-effect transistor and is swept over, at least partially, by the electrode as it is deflected.

6. The measuring element of claim 1, wherein the electrode is perforated.

7. The measuring element of claim 1, wherein the electrode is part of a micro-mirror or of an inertial sensor.

8. The measuring element of claim 1, further comprising:
an elastic element with the aid of which the electrode is deflectably mounted on the semiconductor substrate.

9. The measuring element of claim 1, wherein an electrode is associated with multiple channels.

10. A resonator, comprising:
a measuring element for recording a deflection, including:
a region situated on a semiconductor substrate; and
an electrode for influencing the conductivity of the region, the electrode being mounted deflectably with respect to the region so that an overlap region having a dimension, which is variable with a deflection of the electrode, results between the electrode and the region;
wherein the output signal of the measuring element is a function of the conductivity of the region and is controllable via the change in the dimension of the overlap region,
wherein at least one of the region and the electrode is configured so that the change in the dimension of the overlap region has a non-linear relationship with the deflection of the electrode, so that a change in the output signal of the measuring element has a non-linear relationship with the deflection of the electrode, and
wherein the electrode is mounted above the region, a distance between the electrode and the region remains constant, and during the deflection of the electrode, the electrode and the region do not touch each other; and
a drive for periodic deflection of the electrode.

11. A measuring device, comprising:
at least one measuring element for recording a deflection, including:
a region situated on a semiconductor substrate; and
an electrode for influencing the conductivity of the region, the electrode being mounted deflectably with respect to the region so that an overlap region having a dimension, which is variable with a deflection of the electrode, results between the electrode and the region;
wherein the output signal of the measuring element is a function of the conductivity of the region and is controllable via the change in the dimension of the overlap region,
wherein at least one of the region and the electrode is configured so that the change in the dimension of the overlap region has a non-linear relationship with the deflection of the electrode, so that a change in the output signal of the measuring element has a non-linear relationship with the deflection of the electrode, and
wherein the electrode is mounted above the region, a distance between the electrode and the region remains constant, and during the deflection of the electrode, the electrode and the region do not touch each other; and
a device for processing the output signal of the measuring element so that an output signal of the measuring device has a linear relationship with the deflection of the electrode.

12. The measuring device of claim 11, wherein the device for processing the output signal of the measuring element has a non-linear characteristic that compensates for the non-linear relationship of the output signal to the deflection of the electrode so as to produce the output signal of the measuring device that has the linear relationship with the deflection of the electrode.

13. A measuring device, comprising:
at least one measuring element for recording a deflection, including:
a region situated on a semiconductor substrate; and
an electrode for influencing the conductivity of the region, the electrode being mounted deflectably with respect to the region so that an overlap region having a dimension, which is variable with a deflection of the electrode, results between the electrode and the region;
wherein the output signal of the measuring element is a function of the conductivity of the region and is controllable via the change in the dimension of the overlap region,
wherein at least one of the region and the electrode is configured so that the change in the dimension of the overlap region has a non-linear relationship with the deflection of the electrode, so that a change in the output signal of the measuring element has a non-linear relationship with the deflection of the electrode, and
wherein the region of the measuring element has a shape corresponding to a circle or an ellipse with upper and lower portions of the circle or ellipse removed along two lines running perpendicular to a direction of movement of the electrode; and
a device for processing the output signal of the measuring element so that an output signal of the measuring device has a linear relationship with the deflection of the electrode.

14. The measuring element of claim 4, wherein the region has a variable length $L_R$ between the drain terminal and the source terminal, and the following relationship applies:

$L_R(y)=\sqrt{L_{R0}^2-a^2y^2}$, where $L_{R0}$ is the length of the region at the place y=0 and a gives the ratio of the radii of the ellipse.

15. The measuring element of claim 1, wherein the at least one region has a non-rectangular shape varying about an axis of symmetry perpendicular to a direction of deflection of the electrode.

16. The measuring element of claim 15, wherein the electrode has an edge occupying a position in an undeflected state of the electrode substantially coinciding with the axis of symmetry of the shape of the region.

17. The measuring element of claim 1, wherein both the at least one region and the electrode have non rectangular shapes.

18. A measuring element for recording a deflection, comprising:
   a region situated on a semiconductor substrate; and
   an electrode for influencing the conductivity of the region, the electrode being mounted deflectably with respect to the region so that an overlap region having a dimension, which is variable with a deflection of the electrode, results between the electrode and the region;
   wherein the output signal of the measuring element is a function of the conductivity of the region and is controllable via the change in the dimension of the overlap region,
   wherein at least one of the region and the electrode is configured so that the change in the dimension of the overlap region has a non-linear relationship with the deflection of the electrode, so that a change in the output signal of the measuring element has a non-linear relationship with the deflection of the electrode, and
   wherein the region has a shape corresponding to a circle or an ellipse, with upper and lower portions of the circle or ellipse removed along two lines running perpendicular to a direction of movement of the electrode.

19. The measuring element of claim 1, further comprising at least one micromechanical spring connecting the electrode to the semiconductor substrate.

20. A resonator, comprising:
   a measuring element for recording a deflection, including:
      a region situated on a semiconductor substrate; and
      an electrode for influencing the conductivity of the region, the electrode being mounted deflectably with respect to the region so that an overlap region having a dimension, which is variable with a deflection of the electrode, results between the electrode and the region;
      wherein the output signal of the measuring element is a function of the conductivity of the region and is controllable via the change in the dimension of the overlap region,
      wherein at least one of the region and the electrode is configured so that the change in the dimension of the overlap region has a non-linear relationship with the deflection of the electrode, so that a change in the output signal of the measuring element has a non-linear relationship with the deflection of the electrode, and
      wherein the region of the measuring element has a shape corresponding to a circle or an ellipse with upper and lower portions of the circle or ellipse removed along two lines running perpendicular to a direction of movement of the electrode; and
   a drive for periodic deflection of the electrode.

21. The resonator of claim 10, wherein the drive produces a sinusoidal deflection of the electrode resulting in the output signal having a symmetric saw tooth form.

22. The resonator of claim 10, wherein the at least one measuring element includes a plurality of measuring elements having a plurality of the regions situated on a same semiconductor substrate and a plurality of the electrodes formed from a same electrode element.

23. The resonator of claim 10, wherein the electrode is part of an electrode element having a recess to delimit boundaries of the electrode.

* * * * *